United States Patent [19]

Du Cloux et al.

[11] Patent Number: 5,625,578
[45] Date of Patent: Apr. 29, 1997

[54] PCB SIMULATION ON BASIS OF REDUCED EQUIVALENT CIRCUIT

[75] Inventors: René Du Cloux; Godefridus P. J. F. M. Maas; Arthur J. H. Wachters, all of Eindhoven, Netherlands; Robert F. Milsom, Redhill; Kevin J. Scott, Horley, both of Great Britain

[73] Assignee: U.S. Philips Corporation, New York, N.Y.

[21] Appl. No.: 207,531

[22] Filed: Mar. 7, 1994

[30] Foreign Application Priority Data

Mar. 8, 1993 [EP] European Pat. Off. .............. 93200671

[51] Int. Cl.$^6$ ...................................................... G06F 17/50
[52] U.S. Cl. ............................................................ 364/578
[58] Field of Search ................................... 364/578, 488, 364/490, 489, 491; 395/500

[56] References Cited

U.S. PATENT DOCUMENTS

| | | | |
|---|---|---|---|
| 4,236,964 | 12/1980 | Bass et al. | 315/117.5 |
| 5,315,233 | 5/1994 | Sakiyama et al. | 324/260 |
| 5,315,537 | 5/1994 | Blacker | 364/578 |
| 5,452,238 | 9/1995 | Kramer et al. | 364/578 |

OTHER PUBLICATIONS

"Field Computation by Moment Methods" R. F. Harrington, MacMillian, New York 1968.
"Automatic Mesh Generation Using the Symmetric Axis Transformation of Polygonal Domains" V. Srinivasan et al, IEEE, vol. 80, No. 9, Sep. 1992, pp. 1495–1501.
Celozzi, Analysis of Fast Transient Electromagnetic Fields: a Frequency Dependent 2–D Procedure, Mar. 1992, pp. 1146–1149.
Milisom, FACET—An RF simulator for arbitrary PCB layout, 1991.
Ise, Dielectric post resonances in a rectangular waveguide, Feb. 1990, pp. 61–66.
Poltz, Cross–Talk and Ringing on a Multilayer PCB, 1989, pp. 347–350.
Sharma, Semiconductor Device Simulation Using Adaptive Refinement and Flux Upwinding, Jun. 1989, pp. 590–598.
Leohold, Calculation of Transformer Winding Resonances by a Specialized Finite Element Method Employing Substructures, Aug. 1988, pp. 1385–1389.

*Primary Examiner*—Kevin J. Teska
*Assistant Examiner*—Matthew Loppnow

[57] ABSTRACT

A method of controlling a circuit simulator for examining the electromagnetic behaviour of an electrical conductor pattern is based on reducing the equivalent circuit model of the pattern. The pattern is first represented by a collection of geometrical elements, whose size is determined by the scale of the geometrical details that is well below the minimum wavelength contemplated. Selection of a set of those elements that lie approximately at a distance of one wavelength from one another and expressing the field values of the non-selected elements in terms of the field values for the selected elements permits correlating a low rank admittance matrix and the matrices of the Maxwell equations. Typically, an effective reduction of four orders of magnitude in the number of equivalent circuit components is obtained without losing model accuracy.

8 Claims, 2 Drawing Sheets

PCB SIMULATION ON BASIS OF REDUCED EQUIVALENT CIRCUIT

FIELD OF THE INVENTION

The invention relates to a method of controlling a circuit simulator used for simulating an electromagnetic behaviour of an electrically conductive pattern. The pattern is provided with input terminals for receiving input signals and output terminals for supplying output signals. The method comprises following steps. A geometric model is created of a surface of the pattern, the geometric model including a collection of contiguous geometrical elements. A respective set of matrix equations is formed, representing Maxwell's equations and involving field values associated with each respective one of the geometrical elements. The values of matrix coefficients in the equations are associated with further coefficients of an admittance matrix representative of an equivalent circuit model for the pattern. The equivalent circuit model is operated upon by the simulator.

BACKGROUND ART

Computer supported circuit simulation has become an indispensable tool in electronic circuitry design to save on time and costs. An aspect of circuitry behaviour that can be modeled is related to electromagnetic compatibility (EMC). EMC is concerned with the circuit's susceptibility to irradiation, crosstalk and emission of radiation. A device is susceptible to irradiation when an incoming electromagnetic field induces currents in the circuit's conductors. Crosstalk occurs when a current in a particular conductor of the circuit gives rise to an inductively or capacitively induced current in another conductor of the circuit. Emission of electromagnetic radiation takes place when a current in a conductive portion of the circuit produces an electromagnetic field that may be picked up by another circuit or system.

In the design of electronic systems, the electromagnetic field concept is replaced by an electric circuit concept. This implies that the electromagnetic field in the electronic system is locally specified in terms of currents and voltages that comply with Kirchhoff's laws. These currents and voltages can be thought of as originating in a dynamically equivalent circuit made up of lumped components such as resistors, capacitors and inductances. Such an equivalent circuit model is created below for a conductor pattern. The actual pattern of conductors of e.g., printed circuit boards (PCBs), antennae, ICs, multi-chip modules (MCMs), leadframes, etc, is translated into a model of virtual equivalent electrical circuit in terms of virtual parts (resistors, capacitors, inductances and voltage sources) that are interconnected via nodes. This equivalent model is thereupon supplied to a circuit simulator, together with circuit models of the actually used electrical or electronic components (i.e., those which in reality are to be soldered onto the PCB) to produce information regarding the actual currents and voltages (throughout the PCB) for investigating the radiation behaviour. The conductors may include wires, whose radii are small compared to the wavelength of the radiation in the surrounding medium and small compared to its length, and planar conductive structures, which are embedded in a dielectric and whose thickness is small compared to the wavelength and to both length and width of the structure. The parameter values of the virtual parts making up the equivalent circuit are obtained as follows. First, the lay-out of the conductors is divided into a plurality of non-overlapping, contiguous geometrical elements, each whereof has a size smaller than a predetermined upper bound. This upper bound depends on, for example, the geometrical details and shapes involved. Element generating algorithms or meshing algorithms are well known in the art. An example of such an algorithm is the Delauney algorithm that divides a planar geometrical domain into triangular elements.

For the collection of the geometrical elements, a discretisized version of Maxwell's differential/integral equations is created in the form of matrix-vector equations, e.g., according to the Boundary Element Method. For the Boundary Element Method, see, e.g., "Field Computation By Moment Methods", R. F. Harrington, Macmillan, N.Y., 1968. The matrices contain terms that eventually can be translated into parameter values of the virtual components of the equivalent circuit by correlation to a Norton multi-port model. Typically, the number of virtual components of the equivalent circuit determined according to above prior art model lies in the order of a billion ($10^9$) or more, i.e., of the square of a characteristic number of geometrical elements. The computation time, needed when simulating the behaviour of the electronic device using the equivalent circuit model, and the number of virtual components are strongly correlated. The state of the art method discussed above renders simulations of larger PCBs, such as computer cards, practically unattainable owing to the massive amount of data involved in the geometrical details of a realistic pattern and hence to the huge numbers of virtual components that are to be taken into account.

OBJECT OF THE INVENTION

It is therefore an object of the invention to extract information regarding the equivalent circuit model in order to provide a model that is considerably simpler to manipulate without adversely affecting the model's validity and without losing any accuracy with regard to the conventional simulation process.

SUMMARY OF THE INVENTION

To this end, the invention provides a method of controlling a circuit simulator as specified in the preamble and characterized by following steps. A group of main elements are identified in the collection of geometrical elements. The group includes main elements that in general lie at a distance, being larger than a prespecified lower bound representative of a minimum wavelength $\lambda$, from one another, and also includes the elements that correspond with said input terminals or said output terminals. The field values related to the complement of the group are expressed in the field values associated with the group. Then, the correlation is executed with the admittance matrix of a rank not larger than a number of main elements contained in the group.

The invention is based on the insight that a finely grained division of the conductor pattern into a plurality of virtual components (of the equivalent circuit) within a given area, whose scale is well below that of the contemplated minimum wavelength, goes far beyond what is still needed for a realistic workable model. Expressing the field values of the complement of the group in terms of the field values of the group itself has the effect that a large number of virtual electrical components belonging to the finer division are functionally combined into a small number of virtual components.

The method of the invention dramatically improves simulator efficiency reflected by a considerable decrease of design costs and computer time. Also, smaller, and therefore cheaper, computers now can be employed to effectively handle the reduced model in the invention. Experiments have been conducted on realistic PCBs in order to compare the performance of the reduced model in the invention with that of the conventional model. It is found that the invention reduces computer processing time by four orders of magnitude without any substantial loss of accuracy for a PCB that conventionally would have led to about 100 geometrical elements and about 10,000 virtual components in the equivalent circuit. In the invention, 3 main elements and 5 virtual components of the equivalent circuit were obtained.

Preferably, the approximation of the conductor pattern by means of a collection of geometric elements employs a method to create quadrilaterals. The conventional Delauney algorithm produces triangular elements. Although Maxwell's differential/integral equations can be converted simply into matrix equations based on triangles, this advantage is at least partially offset by the large number of triangles produced. The segmentation into quadrilaterals according to the invention produces substantially fewer elements at the expense, if any, of a slightly more complicated discretization.

Preferably, the matrix equations are expressed in terms of electric current, electric charge density and electric potential. This leads to a simple mapping onto the equivalent circuit's admittance matrix.

Preferably, a characteristic size, say h, of each of the geometrical elements is substantially smaller than the minimum wavelength, say $\lambda$. Then, the coefficients of the matrices in the matrix equations can be expanded in a Taylor series in $(h/\lambda)$. Neglecting the second and higher order terms of the series expansion introduces a quasi-static approximation to the unknown charge and current densities, i.e., the electromagnetic field is determined locally by the quasi-static currents and charges. It is found that this approximation works well in practice because the geometrical details of the conductor pattern typically are small compared to the wavelength of operation. Consequently, the frequency dependencies of the electromagnetic fields are much simpler than the fields' spatial variations. Moreover, using the truncated Taylor expansion permits the calculation of the electric current and voltage components appearing in the matrix equations, being uniform with respect to a range of frequencies. This is quite an advantage regarding the efficiency of the model, as the dependencies on the frequency are introduced as mere scaling factors to expressions that are uniform throughout the range considered. Consequently, storage of the equivalent circuit model's parameters, e.g., for repeated simulation runs, needs only a modest memory capacity that is considerably lower than in the prior art. In the prior art, all parameters need to be stored for each individual frequency value.

BRIEF DESCRIPTION OF THE DRAWING

The invention is explained hereinafter by way of example and with reference to the accompanying drawing, wherein.

DETAILED DESCRIPTION OF THE PREFERRED EMBODIMENT

Lay-out

Figure 1:
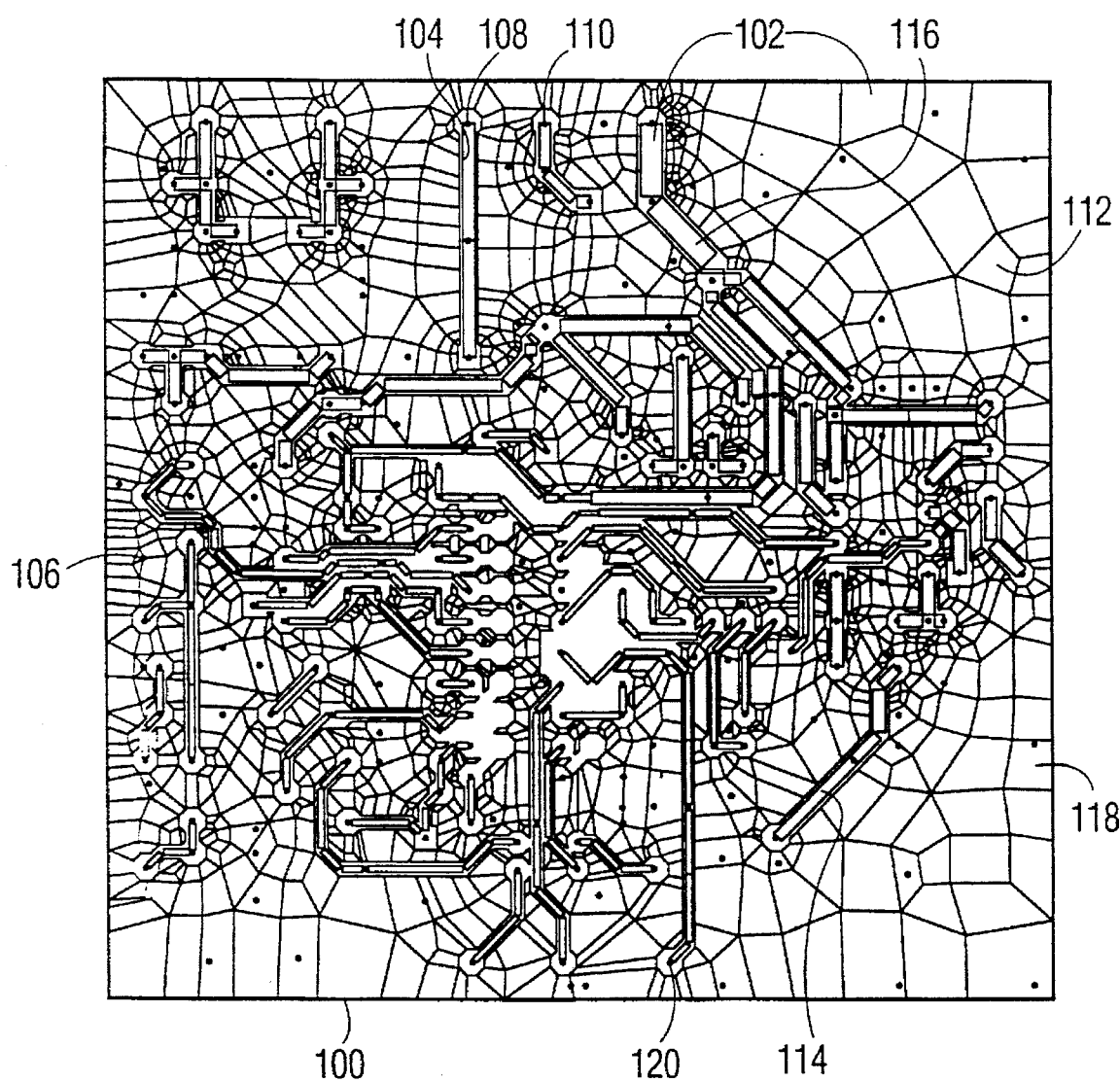
FIG. 1 shows an example of a segmented lay-out of a conductor pattern.

FIG. 1 illustrates an example of a lay-out of a PCB 100. Typically PCB 100 is composed of a foil 102 of electrically conductive material, e.g., aluminum, wherein a pattern of conductive tracks is created by means of selectively removing the conductive material along predetermined curves that form the outlines of the eventual tracks, e.g., by etching techniques. The tracks interconnect contact nodes (or ports) for receiving and supplying the electrical input signals and output signals of electric or electronic components (not shown) that are to be soldered onto PCB 100. For clarity, only a pair of tracks is indicated by reference numerals 104 and 106, and a pair of contacts is indicated by reference numerals 108 and 110. PCB 100 may also include thin electrically conductive wires.

The electrical properties of PCB 100 are to be translated into terms that relate to an imaginary equivalent electrical circuit composed of resistors, capacitors, inductances and voltage sources. This equivalent circuit is then supplied to a circuit simulator. To achieve this, the Boundary Element Method (BEM) is applied. That is, the geometry of the conductive surfaces, tracks and surrounding foil is approximated by a collection of contiguous geometrical elements. On each such geometrical element, suitable representations of Maxwell's equations are produced taking the form of matrix equations. Finally, the matrices thus obtained are mapped onto an admittance matrix, whose coefficients represent the values of the imaginary components of the equivalent circuit.

Meshing

The lay-out of the conductive portions of PCB 100 is divided into a plurality of non-overlapping geometric elements. Each element is smaller than an upper bound, determined by the contemplated minimum wavelength. This segmentation is performed automatically through a mesh generator, i.e., a computer program that partitions a geometrical model of an object into elements providing an appropriate balance between accuracy and efficiency. For background information, see, for instance, "Automatic Mesh Generation Using the Symmetric Axis Transformation of Polygonal Domains", V. Srinivasan et al., Proc. IEEE., Vol 80, No. 9, September 1992, pp. 1495–1501. An example of a mesh generating algorithm is the Delauney algorithm as mentioned above that produces triangular geometrical elements.

It turns out that the elements' geometrical shape determines the number of elements generated and the complexity of the calculations. In particular, the basis functions, assumed to provide a mathematical basis to adequately approximate the currents, charges and scalar potentials, tend to become more complicated when the geometrical element's shape involves more details. The discretisized Maxwell's equations can be handled with relatively simple basis functions when mapped onto triangular elements, but a realistic conductor pattern gives rise to a large number of such triangular elements, thereby more or less offsetting the advantage of relatively simple formulae. The invention therefore preferably uses a mesh generating algorithm that produces quadrilateral elements to reduce the overall number of elements by at least a factor of two, taking the slightly more complicated basis functions for granted. In addition, a better representation of the current densities is achieved using quadrilaterals. A quadrilateral segmentation may be achieved, for example, by first applying the Delauney algorithm and thereupon combining the triangles to form quadrilaterals. The result may be optimized to remove large and small angles. Applying such an algorithm to the lay-out leads to the meshing shown in FIG. 1, wherein a few of the meshes are indicated with reference numerals 112, 114 and 116.

Matrix form Maxwell's equations

Once the segmentation is obtained, the matrix equations (the so-called Norton multi-port model) are created. Maxwell's equations are used to define the radiation in three-dimensional space in terms of current densities and charge densities at the conductive surfaces of the pattern. As is explained below, it is found that a particular representation of Maxwell's equations considerably simplifies the interpretation of coefficients involved in the matrices as admittances of the imaginary components in the equivalent circuit by means of relating the matrices to an admittance matrix.

The following reasonable assumptions are assumed to hold true:

The minimum wavelength of the radiation is much larger than the thickness of the planar pattern. This is equivalent to neglecting electrical propagation delays throughout the pattern.

The electromagnetic field varies sinusoidally with time.

The near-field approximation of the electromagnetic field is valid. This is equivalent to the assumption of a static or quasi-static behaviour.

It can be shown that the following vector equations are to be satisfied on the pattern's conductive surface S. Note that vectors and tensors are indicated in bold type letters.

$$Zn \times J - n \times i\omega\mu_0 \int_S G \cdot J \, dA + n \times \nabla\phi = -K; \quad \text{(i)}$$

$$\nabla \cdot J - i\omega\rho = 0; \quad \text{(ii)}$$

$$\phi - (1/\epsilon_0) \int_S K\rho \, dA = 0; \quad \text{(iii)}$$

wherein:

S=surface of conducting pattern;
Z=surface impedance of conducting pattern;
n=outward pointing unit vector perpendicular to S;
J=surface current density on S;
$i=\sqrt{(-1)}$;
$\omega$=angular frequency;
$\mu_0$=magnetic permeability of vacuum;
G=tensorial Green function for magnetic vector potential A according to:

$$A(x) = \mu_0 \int_S G(x,y) \cdot J(y) \, dA(y) \quad \text{(iv)}$$

$\phi$=electric scalar potential;
K=representation of the boundary conditions in terms of potentials that exist at the input and output terminals 108 and 110, see explanation below;
$\rho$=surface charge density on S;
$\epsilon_0$=dielectric constant of vacuum;
K=scalar Green function for electric scalar potential $\phi$, and related to G(x,y) according to:

$$V_x \cdot G(x,y) = V_y K(x,y) \quad \text{(v)}$$

In above equations all quantities are expressed in SI units. Expression (i) is a representation of Ohm's law, expression (ii) reflects the conservation of electric charge, and expression (iii) ties the electric potential to the charge distribution.

The quantity K is introduced to account for the boundary conditions that exist at the input and output terminals that constitute the connections to, e.g., SMDs to be soldered on the PCB. K is specified in terms of (yet unknown) potentials at these terminals. Later on, K will be translated into a suitable vector S appearing in the matrix formulation of Maxwell's equations and will enable the extraction of the values of the coefficients of the admittance matrix by successively making one of the components of S equal to one and the other components equal to zero. The vector K for this purpose is defined as being non-zero only at the cylindrical geometrical elements representing the input and the output terminals:

$$K = \Sigma_n U_n k_n; \quad \text{(vi)}$$

wherein $U_n$ stands for the potential of cylindrical element indicated by index "n" and wherein $k_n$ stands for a normalized azimuthal vector on the cylindrical element "n" and uniform along the circumference of cylindrical element "n". Again, note that K is a mere artificial representation in order to include the boundary conditions for a special purpose later on.

The conducting surface is represented by segments as discussed above. Thin wires that constitute a portion of conducting surface S each are segmented into a plurality of cylindrical surface elements. Planar conductors that constitute a portion of conducting surface S each are segmented into a plurality of quadrilaterals. The collection of cylindrical surface elements and quadrilaterals is referred to as the set of elements V. Being given the set V of elements with predetermined shape, the surface current density J(x), scalar potential $\phi(x)$ and surface charge density $\rho(x)$ each are expressed as a linear combination of basis functions $w_k(x)$, $X_k(x)$ and $\psi_k(x)$, respectively. One proceeds as follows.

Current density J(x) is written as:

$$J(x) = \Sigma I_k w_k(x); \quad \text{(vii)}$$

wherein the coefficient $I_k$ is the net current through edge "k" of the element that contains location x, and wherein the summation is taken over all edges of the element containing location x. Basis function $w_k(x)$ is defined on the edges of geometrical element "k", and are such that for two adjacent elements the component of $w_k(x)$ perpendicular to the common edge is continuous. Further, if for an element "k" the sum of net the incoming currents equals zero, then the divergence of the current J(x) for each location x in element "k" equals zero. Therefore, these basis functions for the surface current density allow for a divergence free current.

Surface charge density $\rho(x)$ is expressed as:

$$\rho(x) = \Sigma Q_k X_k(x); \quad \text{(viii)}$$

wherein $Q_k$ stands for the net electrical charge of element "k", and wherein basis function $X_k(x)$ equals $1/A_k$, if x lies in element "k", $A_k$ being the area of surface element "k", and is zero otherwise. Scalar potential $\phi(x)$ is expanded according to:

$$\phi(x) = \Sigma V_k \psi_k(x); \quad \text{(ix)}$$

wherein $V_k$ is the potential of element "k", and wherein basis function $\psi_k(x)$ equals unity if x lies in element "k", and is zero otherwise.

Next, expansions (vii), (viii) and (ix) are substituted into the weak-formulation version of equations (i), (ii) and (iii), i.e., into the corresponding integral equations that result from the integration of equations (i), (ii) and (iii) over S after each thereof has been multiplied by a proper test function. The weak formulation avoids derivatives of the scalar potential through partial integration and leads to symmetric matrices that have a simple physical interpretation. The result is a set of matrix equations given below. Matrices and vectors are represented in bold type letters:

$$(R-i\omega L)I - P\,v = -S \tag{x}$$

$$P^T I - i\omega MQ = 0 \tag{xi}$$

$$M^T V - DQ = 0 \tag{xii}$$

Herein I stands for the vector with components $I_k$, Q for the vector having components $Q_k$ and V for the vector with components $V_k$. Note that the character of (x) is that of Kirchhoff's voltage law and that the character of (xi) is that of Kirchhoff's current law. The matrix coefficients and vector S are as follows:

$$R_{ij} = Z \int_S w_i(x) \cdot w_j(x) dA_x; \tag{xii}$$

$$L_{ij} = \mu_0 \int_S w_i(x) \cdot \int_S G(x,y) \cdot w_j(y) dA_y dA_x; \tag{xiv}$$

$$D_{ij} = (1/\epsilon_0) \int_S \chi_i(x) \int_S K(x,y) \chi_j(x) dA_y dA_x; \tag{xv}$$

$$M_{ij} = \int_S \psi_i(x) \chi_j(x) dA_x; \tag{xvi}$$

$$P_{ij} = \int_S \psi_j(x) \nabla \cdot w_i(x) dA_x; \tag{xvii}$$

$$S_i = \int_S (n \times w_i(x)) \cdot K dA_x. \tag{xviii}$$

With the particular basis functions specified above it is clear that:

$$M_{ij} = \delta_{ij}; \tag{xix}$$

$P_{ij} = +1$, if a current flows through edge "i" of element "j" from the inside to the outside of element "j"; $-1$, if a current flows through edge "i" of element "j" from the outside to the inside of element "j"; 0, otherwise. (xx)

Charge vector Q appearing in equations (xi) and (xii) is eliminated by using (xii) to express Q in terms of V. This simply leads to:

$$(R-i\omega L)I - PV = -S; \tag{xxi}$$

$$P^T I - i\omega CV = 0; \tag{xxii}$$

wherein the matrix C is the inverse of matrix D. Matrix L and matrix C contain the inductive and electrostatic interactions, respectively. Source term S in (xxi) contains the prescribed voltages at the input/output terminals and can be incorporated in the term P V of (xxi):

$$(R-i\omega L)I - PV = 0; \tag{xxiii}$$

$$P^T I - i\omega CV = 0. \tag{xxiv}$$

Now, consider the set V of all geometrical elements in the approximation for the conductor pattern. Suppose that the elements are divided according to some prespecified criterion between two subsets, N and N', that are one another's complement and together form set V. This partitioning into subsets is introduced into matrix equations (xxii) and (xxiii) as follows. The matrix coefficients and the vector coefficients are grouped into matrix blocks or vector blocks, each block being associated with either subset N, subset N', or a particular one of subset-combinations: NN, N'N', NN' and N'N that represent interactions between a pair of respective geometrical elements belonging to the respective subsets. As known, such a grouping is accomplished by appropriate multiplication by permutation matrices. Herein below, the group N of the main geometrical elements is the group that contains the (cylindrical) terminals for connection to, e.g., the SMDs to be soldered onto the PCB, and the planar geometrical elements that lie substantially at a distance of the expected minimum wavelength from one another and from said terminals. In FIG. 1 these main elements, such as 118 and 120, are indicated with a dot.

Accordingly, the following partitioning is realized:

$$P = (P_{N'}, P_N); \tag{xxv}$$

$$C = (C_{N'N'} C_{N'N}\ C_{NN'} C_{NN}); \tag{xxvi}$$

$$V = (V_{N'}, V_N). \tag{xxvii}$$

Also, the current associated with the elements of subset N is separated according to:

$$J = (0, J_N) \tag{xxviii}$$

Substitution of (xxv)–(xxviii) into (xxiii)–(xxiv) results in following equations:

$$(R-i\omega L)I - P_{N'}V_{N'} = P_N V_N; \tag{xxix}$$

$$P^T_{N'}I - i\omega C_{N'N'}V_{N'} = i\omega C_{N'N}V_N; \tag{xxx}$$

$$J_N = P^T_N I - i\omega C_{NN'}V_{N'} - i\omega C_{NN}V_N; \tag{xxxi}$$

Now, the first two equations (xxix) and (xxx) are solved for $V_{N'}$ and I under a particular set of source terms $V_N$ occurring in the expressions at the right hand sides:

$$V^n_{N,m} = \delta_{mn}; \tag{xxxii}$$

wherein $\delta_{mn}$ is the Kronecker delta. The results of equations (xxix) and (xxx) solved under condition (xxxii) are:

$$[E_{N'} - \{P^T_{N'}(R-i\omega L)^{-1}P_{N'}\}^{-1}i\omega C_{N'N'}]V^n_{N'} = (P^T_{N'}(R-i\omega L)^{-1}P_{N'})^{-1}(-P^T_{N'}(R-i\omega L)^{-1}P_N + i\omega C_{N'N})V^n_N; \tag{xxxiii}$$

and $$I^n = (R-i\omega L)^{-1}(P_{N'}V^n_{N'} + P_N V^n_N); \tag{xxxiv}$$

wherein $E_{N'}$ denotes the identity matrix of rank |N'|. Substitution of $V^n_{N'}$ and $I^n$ into (xxxi) produces the currents $J^n_N$ flowing into the conductor pattern. Note that the currents $J^n_N$ thus obtained each time under a unity voltage at a particular input terminal, the others being grounded, constitute the columns of the desired admittance matrix Y according to:

$$YU=J; \qquad \text{(xxxv)}$$

wherein the vector U stands for the voltages at the input-output terminals. The conductor pattern therefore can be fully described by admittance matrix Y in the general Norton multi-port model:

$$YU-J=M; \qquad \text{(xxxvi)}$$

wherein the vector M stands for the Norton current sources due to incident fields.

What has been done up to now is that the conductor pattern is translated into an admittance matrix Y, which has been calculated by means of considering a variety of states with a unit voltage at a single input. This has also produced the values of currents I in (xxxiv), determined by the unit voltage and associated with the complement group N'. The currents, i.e., the components of I, that are present when other input voltages or a combination of other voltages are applied, are obtained by means of an appropriate scaling of the current values, which were produced under a unit voltage, by the values of the other voltages. This is due to the linear dependencies.

Now, let a characteristic size of each geometrical element be given by a value "h", let $k_0$ stand for the free space wave number, let $\Omega$ be the maximum frequency of operation and let $\Lambda$ stand for the wavelength associated with $\Omega$. Let size "h" be chosen such that the following relationship hold true:

$$k_0 h = \omega h \sqrt{(\epsilon_0 \mu_0)} = 2\pi \omega h/(\Omega \Lambda) << 1; 0 < \omega < \Omega; \qquad \text{(xxxvii)}$$

It then follows that equations (xiv), (xv) and (xiii) are approximated up to the order of $(k_0 h)^2$ by:

$$i\omega L_{mm} \approx ik_0 h \sqrt{(\mu_0/\epsilon_0)}; \qquad \text{(xxxviii)}$$
$$i\omega C_{mm} \approx ik_0 h \sqrt{(\epsilon_0/\mu_0)}; \qquad \text{(xxxix)}$$
$$R_{mm} \approx Z. \qquad \text{(xL)}$$

This corresponds to replacing the Green functions associated with the magnetic vector potential and the electric scalar potential by their respective static versions. Combining above approximations (xxxviii), (xxxix) and (xL), the left hand side of (xxxiii) can be simplified using:

$$\{P^T_{N'}(R-i\omega L)^{-1}P_{N'}\}^{-1}i\omega C_{N'N'} \approx ik_0 h \text{ for R being different from 0; or}$$
$$\{P^T_{N'}(R-i\omega L)^{-1}P_{N'}\}^{-1}i\omega C_{N'N'} \approx (ik_0 h)^2 \text{ for R equals 0}. \qquad \text{(xLi)}$$

Employing the static Green functions mentioned above, it follows that L and C are real and symmetric matrices, representing the inductance matrix and the (short circuit) capacitance matrix. Returning now to (xxxiii), the vector $V^n_{N'}$ can be expanded in powers of $ik_0 h$, the result of which is substituted into (xxxiv) to obtain $I^n$. Therefore, the vector $V^n_{N'}$ is written as:

$$V^n_{N'}=V^n_0+V^n_1; \text{ and} \qquad \text{(xLii)}$$

and the vector $I^n$ is expressed as:

$$I^n=I^n_0+I^n_1. \qquad \text{(xLiii)}$$

The 2-tuples $(V^n_0, I^n_0)$ and $(V^n_1, I^n_1)$ are successively obtained from the following sets of equations:

$$(R-i\omega L)I^n_0-P_{N'}V^n_0=P_N V^n_N; \qquad \text{(xLiv)}$$

$$P^T_{N'}I^n_0=0; \qquad \text{(xLv)}$$

and;

$$(R-i\omega L)I^n_1-P_{N'}V^n_1=0; \qquad \text{(xLvi)}$$

$$P^T_{N'}I^n_1=i\omega C_{N'N'}]V^n_0+i\omega C_{N'N}]V^n_N. \qquad \text{(xLvii)}$$

Substitution into equation (xxxi) leads to:

$$I^n_N=P^T_N(I^n_0+I^n_1)-i\omega C_{NN'}V^n_0-i\omega C_{NN}V^n_N. \qquad \text{(xLviii)}$$

Expression (xLviii) is correct up to the order of $(k_0 h)^2$ and represents the n-th column of the desired admittance matrix Y.

Note that the expression $(R-i\omega L)$ can be validly approximated by:

$$(R-i\omega L) \approx R_0 \text{ for } 0<\omega<<\omega_0; \qquad \text{(xLix)}$$

wherein R gives the zero frequency resistance and $\omega_0$ denotes an upper bound beyond which frequency dependent phenomena come into the picture. The set of equations (xLiv)–(xLvii) can be solved effectively independent of the frequency. The quantities $V^n_0$ and $I^n_0$ then are frequency-independent, whereas $V^n_1$ and $I^n_1$ are proportional to the frequency. As an alternative, the expression $(R-i\omega L)$ becomes for $\omega > \omega_0$:

$$(R-i\omega L) \approx i\omega L, \text{ for } \omega > \omega_0. \qquad \text{(L)}$$

Again, the equations can be solved independently of the frequency. The quantity $V^n_0$ then is independent of the frequency, $I^n_0$ is inversely proportional to the frequency, $V^n_1$ is proportional to the square of the frequency and $I^n_1$ is proportional to the frequency. Solving above equations without each time having to take the frequency into account, i.e., solving the equations uniformly for all frequencies in the relevant interval, further reduces the computing time required and the memory capacity needed to handle the model in the invention.

Summarizing, introducing the division into main geometrical elements and other geometrical elements into the matrix equations (xxiii) and (xxiv) permits one to create the admittance matrix Y of a low rank by successively prescribing a unit voltage at the main elements. This admittance matrix is used to represent the conductor pattern, e.g., the PCB, in the circuit simulator when considered as connecting the SMDs. The values of the currents, associated with all elements and resulting from the unit voltages, are stored in a memory. In the presence of voltages other than the unit voltages as may be produced during the simulation, the stored values have merely to be scaled for obtaining the actual values. These actual current values are thereupon used to determine the electromagnetic field in the vicinity of the conductor pattern, either by a static approach for the nearby field or with help of a propagator to calculate the far-off field by taking phase differences into account. Since in the calculations the frequency is separated from the other physical quantities as explained with reference to (xxxvii)–(Lvii), all calculations need to be done only once for the frequency range of interest.

Figure 2:
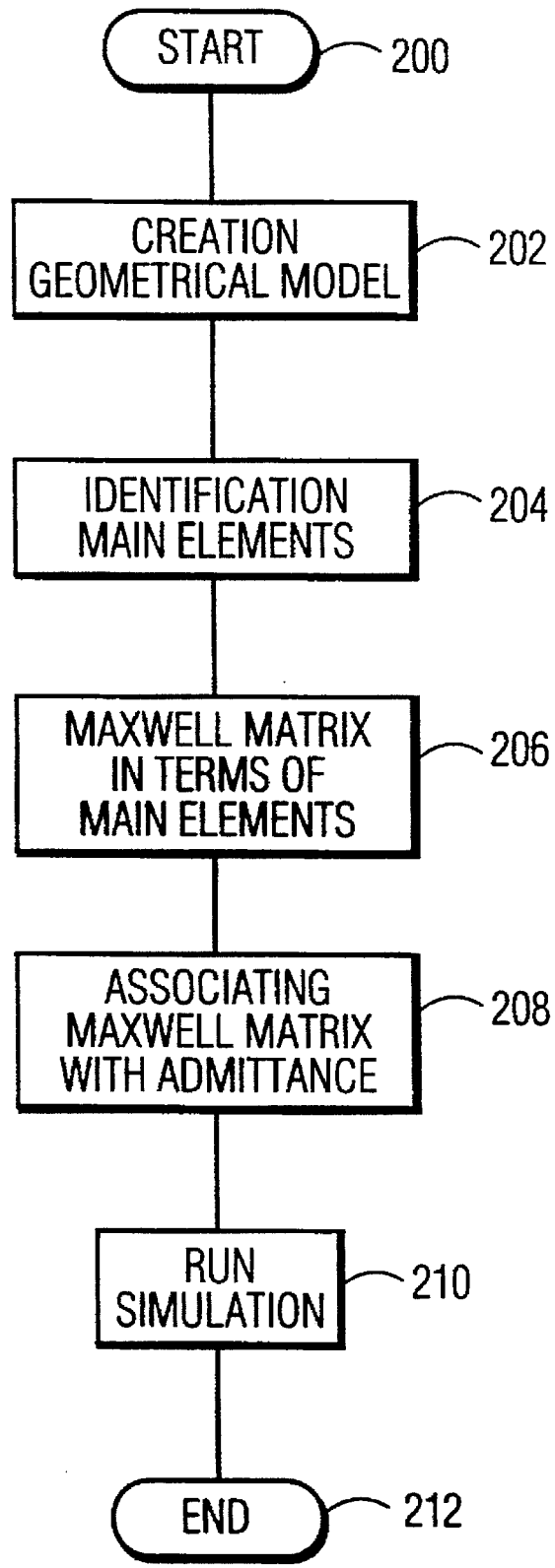
FIG. 2 shows a flow diagram illustrating the method of the invention.

FIG. 2 is a flow diagram of the method in the invention. Terminal 200 marks the beginning of the method. Block 202 represents the creation of a geometrical model in terms of contiguous geometrical elements covering the surface of the electrically conductive pattern. Block 204 marks the identification of the main elements. Block 206 identifies the creation of Maxwell's equations in matrix form, wherein the field values of geometrical elements, other than the main elements, are expressed in terms of the field values of the main elements. This distinction between main and other elements is based on the scale length representative of the minimum wavelength contemplated, and leads to the dramatic reduction of compute performance required. Block 208 stands for the associating of the matrix coefficients obtained in the previous step with the further coefficients of an admittance matrix, representative of the equivalent model. Block 210 stand for running the simulation using the equivalent model. Terminal 212 signifies the end of the procedure.

What is claimed is:

1. A method of controlling a boundary element circuit simulator used for simulating an electromagnetic behaviour of a geometrically non-uniform electrically conductive pattern that is provided with input terminals for receiving input signals and output terminals for supplying output signals, the method comprising the steps of:

creating a geometric model of a surface of the patterns, the geometric model including a collection of contiguous geometrical elements;

forming a respective set of matrix equations, representing Maxwell's dynamic equations and involving field values associated with each respective one of the geometrical elements;

identifying a group of main elements in the collection of geometrical elements, the group including the main elements that in general lie at a distance, being larger than a prespecified lower bound representative of a minimum wavelength, from one another, and also including the main elements that correspond with said input terminals and said output terminals;

expressing the field values related to a complement of the group in the field values associated with the group;

associating values of matrix coefficients in the matrix equations to further coefficients of an admittance matrix representative of an equivalent circuit model for the pattern and of a rank no larger than a number of main elements contained in the group; and operating on the equivalent model by the simulator.

2. The method of claim 1, wherein a characteristic size h of each of the geometrical elements is substantially smaller than the minimum wavelength $\lambda$.

3. The method of claim 1, wherein a majority of the geometrical elements are quadrilaterals.

4. The method of claim 1, wherein the field values include values of an electrical current, an electrical charge density, and an electric potential.

5. The method of claim 3, wherein particular ones of the coefficients of the matrices include a truncated series expansion in $h/\lambda$.

6. The method of claim 2, wherein the field values include values of an electrical current, an electrical charge density, and an electric potential.

7. The method of claim 3, wherein the field values include values of an electrical current, an electrical charge density, and an electric potential.

8. The method of claim 4, wherein particular ones of the coefficients of the matrices include a truncated series expansion in $h/\lambda$.

* * * * *